(12) United States Patent
Chiu et al.

(10) Patent No.: US 9,130,026 B2
(45) Date of Patent: Sep. 8, 2015

(54) CRYSTALLINE LAYER FOR PASSIVATION OF III-N SURFACE

(71) Applicant: Taiwan Semiconductor Manufacturing Co., Ltd., Hsin-Chu (TW)

(72) Inventors: Han-Chin Chiu, Kaohsiung (TW); Trinh Hai Dang, Hsinchu (TW); Hsing-Lien Lin, Hsin-Chu (TW); Cheng-Yuan Tsai, Chu-Pei (TW); Chia-Shiung Tsai, Hsin-Chu (TW); Xiaomeng Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/016,302

(22) Filed: Sep. 3, 2013

(65) Prior Publication Data

US 2015/0060873 A1      Mar. 5, 2015

(51) Int. Cl.
*H01L 29/778*      (2006.01)
*H01L 29/66*       (2006.01)

(52) U.S. Cl.
CPC ........ *H01L 29/778* (2013.01); *H01L 29/66431* (2013.01); *H01L 29/7785* (2013.01)

(58) Field of Classification Search
CPC .................... H01L 29/66431; H01L 29/778
See application file for complete search history.

(56) References Cited

U.S. PATENT DOCUMENTS

| | | | |
|---|---|---|---|
| 6,849,882 B2 | 2/2005 | Chavarkar et al. | |
| 7,649,215 B2 | 1/2010 | Beach | |
| 2003/0052374 A1* | 3/2003 | Lee et al. | 257/406 |
| 2004/0007786 A1* | 1/2004 | Kim | 257/E33.002 |
| 2006/0145190 A1* | 7/2006 | Salzman et al. | 257/192 |
| 2007/0018210 A1* | 1/2007 | Sheppard | 257/289 |
| 2012/0119219 A1* | 5/2012 | Takado et al. | 257/76 |
| 2013/0341678 A1* | 12/2013 | Green et al. | 257/192 |
| 2014/0239307 A1* | 8/2014 | Dargis et al. | 257/76 |

FOREIGN PATENT DOCUMENTS

JP      2008140813      * 6/2008

OTHER PUBLICATIONS

U.S. Appl. No. 14/488,380, filed Sep. 17, 2013.
O. Hilt, et al.; "Normally-off AlGaN/GaN HFET with p-type GaN Gate and AlGaN Buffer"; Proceedings of the 22nd International Symposium on Power Semiconductor Devices & ICs, Hiroshima; 2010; p. 1-4.
Injun Hwang, et al.; "p-GaN Gate HEMTs with Tungsten Gate Metal for High Threshold Voltage and Low Gate Current"; IEEE Electron Device Letters, vol. 34, No. 2, Feb. 2013, p. 202-204.

(Continued)

*Primary Examiner* — Matthew Reames
(74) *Attorney, Agent, or Firm* — Eschweiler & Associates, LLC

(57) ABSTRACT

Some embodiments of the present disclosure relates to a crystalline passivation layer for effectively passivating III-N surfaces. Surface passivation of HEMTs reduces or eliminates the surface effects that can otherwise degrade device performance. The crystalline passivation layer reduces the degrading effects of surface traps and provides a good interface between a III-nitride surface and an insulator (e.g., gate dielectric formed over the passivation layer).

20 Claims, 4 Drawing Sheets

(56) References Cited

OTHER PUBLICATIONS

A. Asgari, et al.; "The Effects of GaN Capping Layer Thickness on Electrical Properties of Two-Dimensional Electron Gas in GaN/AlGaN/GaN Heterostructures"; School of Electrical, Electronic and Computer Engineering, the University of Western Australia; Prior to Sep. 3, 2013; p. 1-3.

Ramakrishna Vetury, et al.; "The Impact of Surface States on the DC and RF Characteristics of AlGaN/GaN HFETs"; IEEE Transactions on Electron Devices, vol. 48, No. 3, Mar. 2001, p. 560-566.

X.Z. Dang, et al.; "Influence of Surface Processing and Passivation on Carrier Concentrations and Transport Properties in AlGaN/GaN Heterostructures"; Journal of Applied Physics; vol. 90, No. 3, Aug. 1, 2001, p. 1357-1361.

Bruce M. Green, et al.; "The Effect of Surface Passivation on the Microwave Characteristics of Undoped AlGaN/GaN HEMT's"; IEEE Electron Device Letters, vol. 21, No. 6, Jun. 2000, p. 268-270.

* cited by examiner

CRYSTALLINE LAYER FOR PASSIVATION OF III-N SURFACE

FIELD

The present disclosure relates to an effective passivation technique for III-N (tri nitride) surfaces.

BACKGROUND

High-electron-mobility transistors (HEMTs), also known as heterostructure FETs (HFETs) or modulation-doped FETs (MODFETs), are field-effect transistors incorporating a junction between two materials with different band gaps (i.e. a heterojunction) as the channel instead of a doped region (as is generally the case for MOSFETs). III-N (tri nitride) devices, such as AlGaN/GaN devices, are one type of HEMT that show very promising performance in high-power and high-frequency applications. III-N devices can be used, for example, in high power-high frequency applications such as emitters for cell phone base stations, Direct Broadcast Satellite (DBS) receivers, electronic warfare systems, etc.

Some aspects of the present disclosure relate to improved passivation techniques for III-N devices.

DETAILED DESCRIPTION

Figure 1:
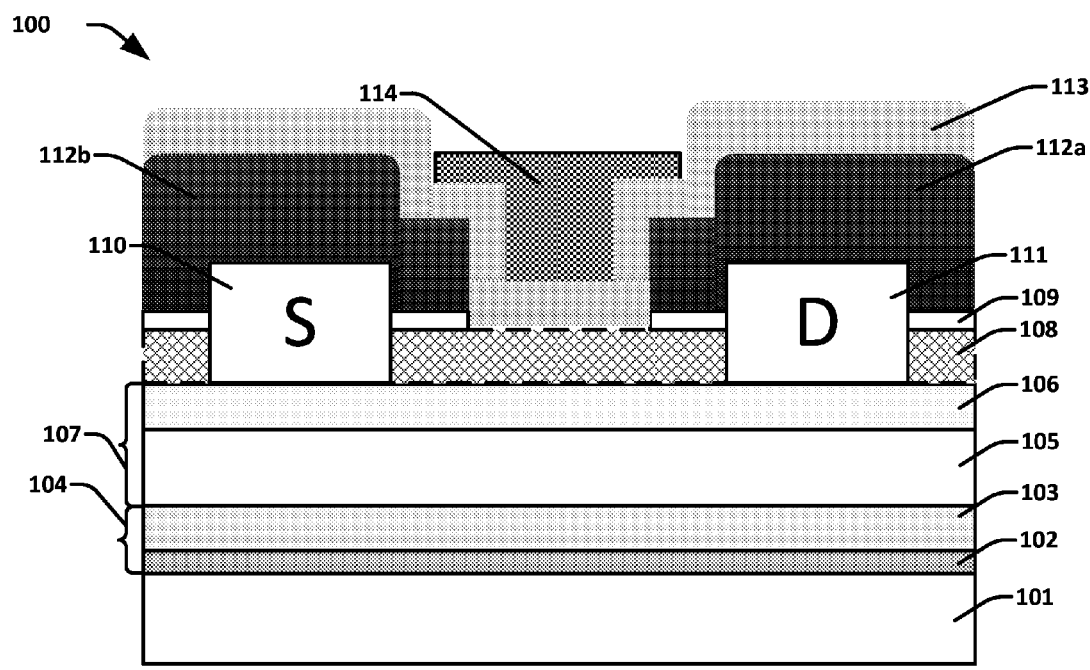
FIG. 1 shows some embodiments of a cross sectional view of a III-N HEMT device with a crystalline passivation layer formed in accordance with the present disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

As mentioned, a HEMT device uses a heterojunction between two materials with different band gaps as a channel. For example, in some III-N HEMT devices, a wide bandgap AlGaN layer can form a heterojunction with a narrow bandgap GaN layer. Ideally, the two different materials used for the heterojunction would have the same lattice constant (spacing between the atoms). In practice, however, the lattice constants are typically slightly different. The difference in the lattice structures of these types of materials produces a strain that can result in dislocation of films grown to produce the different layers. This strain can result in interface trap states that slow the response of the device. The interface trap states are assumed to be associated with surface states created by dangling bonds, threading dislocations accessible at the surface, and ions absorbed from the ambient environment. These states trap electrons injected by the gate and create a layer of charge at or near the surface that depletes the channel in the high field region between the gate and drain.

To attempt to limit the number of traps (and thereby improve device performance), the present disclosure sets forth techniques where a crystalline passivation layer is formed on a III-N surface to effectively passivate the III-N surface. This crystalline passivation layer, which can be formed between the gate dielectric and the III-N surface (e.g., channel region), terminates and passivates dangling bonds on the surface of III-N surface to limit the number of interfacial traps and helps to improve device performance. More particularly, the crystalline passivation layer can have a lattice constant that matches with the III-nitride material and the dielectric layer on top of it, and hence provides suitable bond-matching to either side of the interface. It also reduces the effects of surface traps by providing a coherent termination of the surface bonds. Thus, a good interface and other practical important properties of the passivation film can be realized by introducing this crystalline passivation layer.

FIG. 1 shows some embodiments of a cross sectional view of a III-N HEMT device 100 with a crystalline passivation layer formed in accordance with the present disclosure. The HEMT device 100 has a buffer layer 104 which is arranged on top of a substrate 101. In the illustrated embodiment, the substrate 101 may be Si, SiC or sapphire. The buffer layer 104 may comprise single or multiple III-N layers which help in nucleation and thermal expansion and which reduce lattice mismatch. In the illustrated embodiment, the buffer layer 104 comprises a first buffer layer 102, such as a AlN layer, and a second buffer layer 103, such as an AlGaN layer. A heterojunction structure 107 comprising a first semiconductor layer 105, which has a first bandgap, and a second semiconductor layer 106, which has a second, different bangap, is arranged on top of the buffer layer 104. A two dimensional electron gas (2-DEG) is formed near the heterojunction interface between the first semiconductor layer 105 and the second semiconductor layer 106. In some embodiments, the first semiconductor layer 105 comprises a first III-N layer (e.g., GaN) and the second semiconductor layer 106 comprises a second III-N layer (e.g., AlGaN). The first and second semiconductor layers may be monocrystalline or polycrystalline. A crystalline passivation layer 108 abuts the top surface of the heterojunction 107. This passivation layer 108, apart from providing a good interface, also reduces the number of surface traps relative to conventional solutions. In some embodiments, the crystalline passivation layer 108 includes AlN or AlGaN. The crystalline passivation layer 108 has a thickness in a range of approximately 20 nm to approximately 5000 nm.

A source metal contact or source region 110 and a drain metal contact or drain region 111 are arranged at opposing ends of the second III-N layer 106. In some embodiments, the source and drain contacts can extend deeper in to the second semiconductor layer 106 and reside at some level within the height of the second semiconductor layer 106 or extend further in to the 2 DEG channel at the interface between the first semiconductor layer 105 and the second semiconductor layer 106. In some embodiments, the source contact 110 and the drain contact 111 are formed by selectively depositing metals like Ti/Al/Ni/Au. On top of the crystalline passivation layer 108 resides another passivation layer 109 which is in amorphous crystalline state. This layer provides further passivation for the 2 DEG channel and helps in reducing 2 DEG channel depletion and trapping effects of surface traps. The amorphous passivation layer 109 is seen in all regions except the source, drain and gate regions, above the crystalline passivation layer 108. In some embodiments the amorphous passivation layer 109 is formed from silicon nitride, silicon dioxide, polyimide or any other suitable low-k dielectric material. A capping layer 112a resides above the drain contact 111 and the amorphous passivation layer 109 in the drain region. Another capping layer 112b resides above the source contact and the amorphous passivation layer 109 in the source region. A high-k dielectric layer 113 is formed above the capping layers 112a and 112b in the drain and source regions respectively and directly on top of the crystalline passivation layer 108 in the gate region. In various embodiments, the high-k gate dielectric layer/gate dielectric 113 may comprise silicon nitride (SiN), aluminum oxide (AlO3), silicon dioxide (SiO2), or other appropriate insulating materials. A gate electrode 114 is deposited over the gate dielectric 113.

During operation, a voltage applied to the gate electrode 114 controls the flow of carriers (e.g., 2-D electron gas) from the source 110 to the drain 111 through a channel region in the heterojunction 107. Thus, whether the HEMT 100 is in a conductive or resistive state can be controlled by controlling the 2 DEG with the help of the gate electrode 114. In many cases HEMT devices are enhancement mode devices, which operate similar to silicon MOSFET devices by normally being in a non-conducting state (normally off). Due to the nature of the AlGaN/GaN interface, and the formation of the 2 DEG at the interface of AlGaN and GaN materials in HEMTs, such devices that are formed in the III-N materials system tend to be normally on, or depletion mode devices. i.e.; the high electron mobility of the 2 DEG at the interface of the AlGaN/GaN layers permits the III-N device, such as a HEMT device, to conduct without the application of a gate potential.

Figure 2:
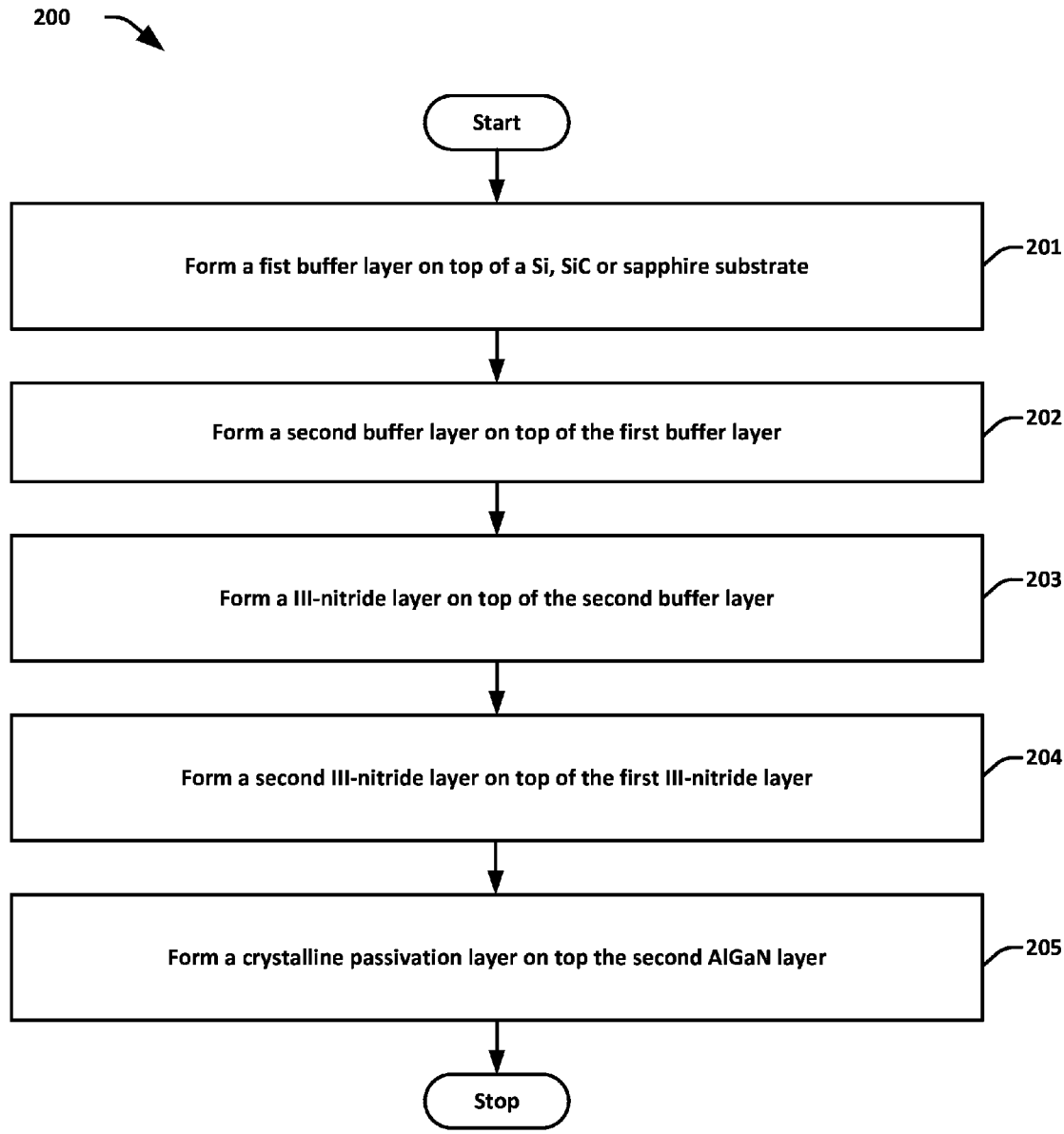
FIG. 2 shows a flow diagram of a method according to some embodiments of the present disclosure.
Figure 3:
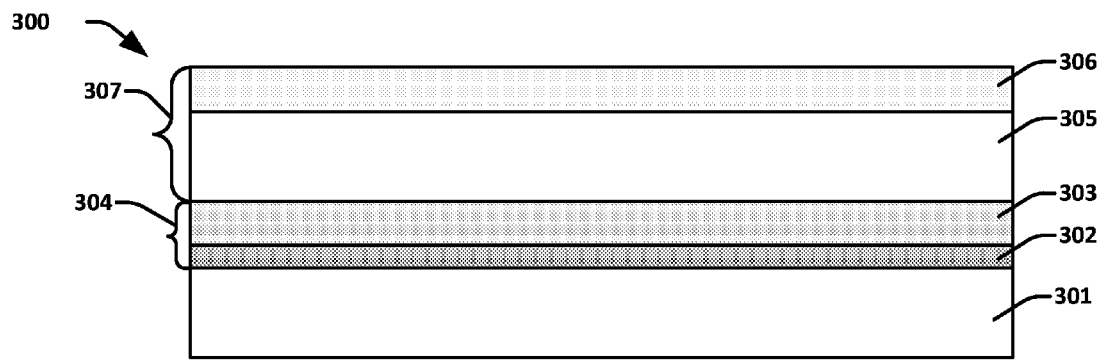
FIG. 3 shows some embodiments of a cross sectional view of a semiconductor device with buffer layers and a III-N heterojunction structure on top of a substrate.

FIG. 2 illustrates a flow diagram of some embodiments of a method 200 for formation of a semiconductor structure according to an embodiment of the disclosure. While method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 201, a first buffer layer is formed on top of a Si, SiC or sapphire substrate. In some embodiments the buffer layer comprises an AlN nucleation layer that is disposed above a Si substrate via MOCVD or MBE.

At 202, a second buffer layer is formed on top of the first buffer layer. In some embodiments a thermal expansion layer of AlGaN is disposed above the buffer layer of AlN via MOCVD or MBE.

At 203, a first III-nitride layer is formed on top of the second buffer layer. In some embodiments a GaN layer is disposed above the AlGaN buffer layer. The GaN layer may comprise a doped GaN (UID-GaN) layer, usually referred as unintentionally doped (e.g., a GaN material not having intentionally placed dopants, but rather having a doping resulting from process contaminants, for example). In one embodiment, the UID-GaN layer may have an n-type doping.

At 204, a second III-nitride layer or electron supply layer is formed on top of the first III-nitride layer. This layer has a band gap that is bigger than that of the first III-N layer so that the heterojunction created by different band-gap materials forms a quantum well (a steep canyon) in the conduction band on the first III-N layer side, creating a high electron mobility channel. In some embodiments, second III-nitride layer comprises a thin film of aluminum gallium nitride (AlGaN) having a band gap that is larger than the band gap of the underlying GaN layer (e.g., AlGaN has a band gap of approximately 4 eV, while GaN has a band gap of approximately 3.4 eV). In some embodiments, the thin film of AlGaN may be intentionally doped to have an n-type doping that provides carriers to the 2-DEG.

At 205, a crystalline passivation layer is formed on top of the second III-N layer. This crystalline layer can be used prior to an insulator deposition step to form a good interface. The crystalline passivation layer can be formed, by ex-situ deposition with the help of epitaxy tools like atomic layer deposition (ALD), chemical vapor deposition (CVD) or physical vapor deposition (PVD), by in-situ deposition in an MOCVD chamber or by depositing an amorphous film of the same material and recrystallizing it using thermal anneal. The crystalline passivation layer has a thickness in a range of approximately 20 nm to approximately 5000 nm. Examples of the materials that may be used as the crystalline passivation layer are AlN, InxAlyGazN (x+y+z=1; 0<x<1, 0<y<1, and 0<z<1)), SiNx, SiOx, Al2O3, BeO, MgO, Ga2O3, La2O3, HfO2, ZrO2, Y2O3, Gd2O3, Ce2O3, Ta2O3 or Ta2O5.

FIGS. 3-7 show a series of cross-sectional views that collectively depict another, more detailed method for manufacturing a high mobility transistor (HEMT) device having a crystalline passivation layer according to some embodiments of the disclosure. This method starts at FIG. 3 where a substrate 301 is provided. The substrate can be a Si, SiC or sapphire substrate. A buffer layer 304, which in the illustrated embodiment comprises a first buffer layer 302 and a second buffer layer 303, is formed over the substrate. The first buffer layer 302 reduces strain between the substrate 301 and overlying layers. In some embodiments, the first buffer layer 302 comprises AlN. A silicon substrate 301 and the AlN nucleation layer have a smaller lattice mismatch and coefficient of thermal expansion than the silicon substrate and gallium nitride, thereby allowing for a reduction in strain between the silicon substrate 301 and an overlying GaN layer. In some embodiments, first buffer layer 302 may have a thickness in a range of between approximately 150 nm to approximately 300 nm. In various embodiments, the second buffer layer 303 comprises an aluminum gallium nitride (AlGaN) layer the AlGaN layer may comprise a chemical formula of $Al_xGa_{1-x}N$, where x is in a range of approximately 0.1 to approximately 0.95 at different positions in the buffer layer 303 (e.g., at a bottom of the buffer layer the chemical formula is $Al_{0.75}Ga_{0.25}N$, in the middle $Al_{0.5}Ga_{0.5}N$, and at the top $Al_{0.25}Ga_{0.75}N$). In some embodiments, the AlGaN layer may have a thickness in a range of between approximately 150 nm to approximately 1200 nm and it may not be graded.

A heterojunction structure 307, which comprises a first III-N layer 305 and a second III-N layer 306, is then formed above the buffer layer 304. In the illustrated embodiment, the first III-N layer 305 comprises GaN and the second III-N layer 306 comprises AlGaN. The GaN layer may comprise a doped GaN (UID-GaN) layer, usually referred as unintentionally doped (e.g., a GaN material not having intentionally placed dopants, but rather having a doping resulting from process contaminants, for example). In one embodiment, the UID-GaN layer may have an n-type doping. The second III-N layer 306 or layer that supplies electrons to the 2 DEG channel is located directly on top of the first III-N layer, such that the top surface of the first III-N layer 305 and the bottom surface of the electron supply layer 306 abut each other. The second III-N layer comprises a material having a band gap unequal to (e.g., larger than) that of the underlying first III-N layer so that a heterojunction, which serves as the HEMT device channel, is formed at the interface of the first III-N layer 305 and second III-N layer 306. In the illustrated embodiment, the heterojunction causes the AlGaN layer 306 to supply electrons to a two-dimensional electron gas (2-DEG) (not shown) located along the interface between the GaN layer 305 and the AlGaN layer 306. The 2-DEG has high mobility electrons that are not bound to any atom, but that are free to move between the source and drain terminals of the GaN transistor device.

Figure 4:
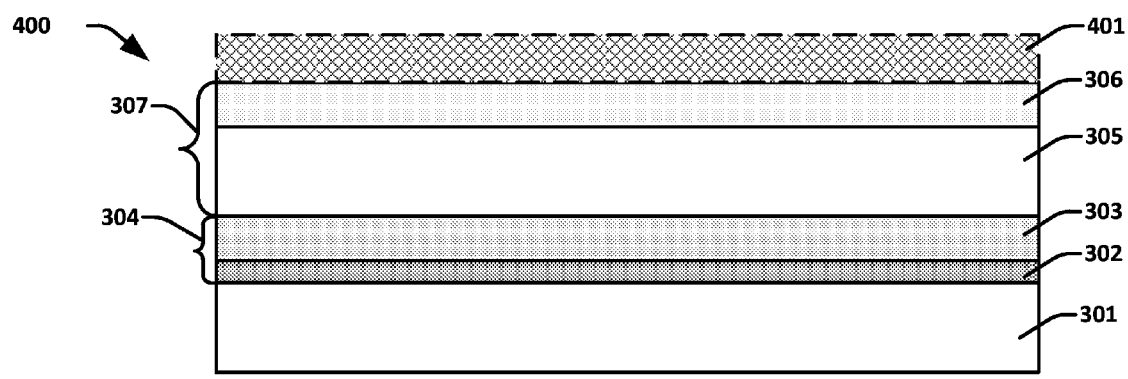
FIG. 4 shows some embodiments of a cross sectional view of a semiconductor device after the deposition of the crystalline passivation layer on top the III-N heterojunction structure.

In FIG. 4, a crystalline passivation layer 401 has been formed to abut the top surface of the second III-N layer 306. Surface passivation of AlGaN/GaN HEMTs reduces or eliminates the surface effects responsible for degrading device performance such as, drain current degradation, larger threshold voltage (Vt) fluctuation, larger off-current leakage, etc. due to the presence of slow-acting trapping states between the gate and drain of the device. The crystalline passivation layer passivates the surface by providing a coherent termination of the surface bonds. It will also provide a good interface between the III-N layer and the gate dielectric by reducing the mismatch between the lattice constants of the III-nitride layer and the gate and thus, the interfacial traps between the III-nitride layer and the insulator on top of it will also be reduced. The crystalline passivation layer 401 can be used prior to an insulator deposition step to form a good interface. The crystalline passivation layer 401 can be formed by in-situ deposition with the help of epitaxy tools that are in charge of III-N crystal growth or by ex-situ tools like atomic layer deposition (ALD), chemical vapor deposition (CVD) or physical vapor deposition (PVD). In some embodiments, the crystalline passivation layer could be in-situ deposited AlN or AlGaN. In some embodiments, the crystalline passivation layer could be formed by depositing crystalline AlN or AlGaN in MOCVD chamber. Furthermore, the crystalline passivation layer could also be formed by depositing an amorphous film of the same material and recrystallizing it using thermal anneal. In some embodiments, the crystalline passivation layer could be formed by depositing an amorphous film of AlN or AlGaN and recrystallizing them after thermal annealing. The crystalline passivation layer 401 has a thickness in a range of approximately 20 nm to approximately 5000 nm. Examples of the materials that may be used as the crystalline passivation layer are AlN, $In_xAl_yGa_zN$ ($x+y+z=1$; $0<x<1$, $0<y<1$, and $0<z<1$)), $SiN_x$, $SiO_x$, $Al_2O_3$, $BeO$, $MgO$, $Ga_2O_3$, $La_2O_3$, $HfO_2$, $ZrO_2$, $Y_2O_3$, $Gd_2O_3$, $Ce_2O_3$, $Ta_2O_3$ or $Ta_2O_5$.

Figure 5:
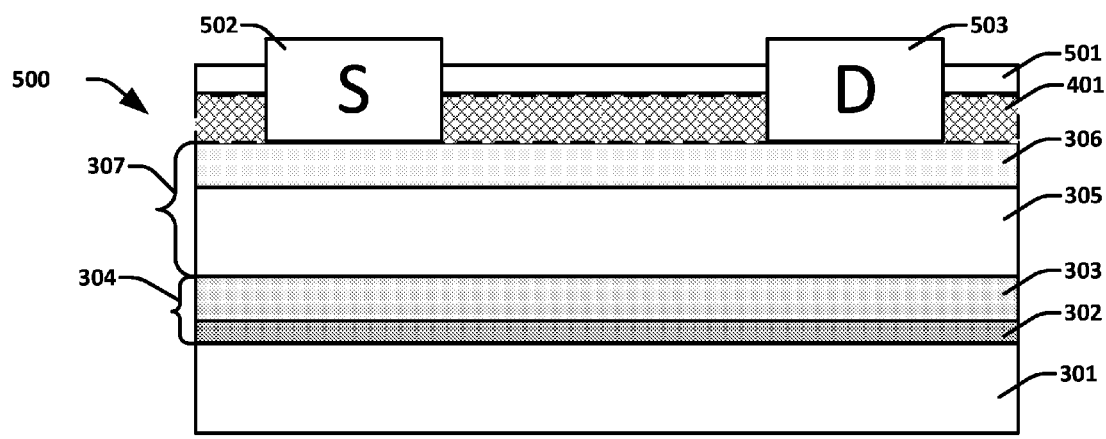
FIG. 5 shows some embodiments of a cross sectional view of a semiconductor device after the deposition of an amorphous passivation layer and the formation of source and drain metal contacts.

In FIG. 5, source and drain metal contacts 502, 503 and an amorphous passivation layer 501 have been formed. The amorphous passivation layer 501 abuts the crystalline passivation layer 401 on its top surface. During device operation, when a high electric field is applied at the gate, the electrons from the AlGaN/GaN heterostructure are injected to the surface states and they induce 2 DEG channel depletion and trapping effects. The amorphous passivation layer 501 provides an increased positive charge at the III-N dielectric interface and thus makes sure the 2 DEG concentration is not reduced due to surface states. The amorphous passivation layer further helps in suppressing the electron injection from the gate to the surface states. Furthermore, the additional passivation layer could provide higher potential barrier between the Schottky and the channel, which suppresses the thermionic emission, tunneling at high temperature, and keeps the gate voltage swing reasonably large for proper operation. In some embodiments the amorphous passivation layer 501 is formed from silicon nitride, silicon dioxide, polyimide or any other suitable low-k dielectric material. As shown in cross-sectional view 500, a source metal contact or source region 502 and a drain metal contact or drain region 503 are formed at opposing ends of the second III-N layer 306. In some embodiments, the source and drain contacts can extend deeper in to the electron supply layer and reside at some level within the height of the second III-N layer or extend further in to the 2 DEG channel at the interface between the first III-N layer 305 and the second III-N layer 306. In some embodiments, the source contact 502 and the drain contact 503 are formed by selectively depositing a metal (e.g., Ti/Al/Ni/Au), by way of a deposition process (e.g., PVD, CVD, etc.), onto the substrate at a position in contact with the heterojunction (e.g., with an uppermost GaN layer 305) so as to form an ohmic contact with a two-dimensional electron gas (2 DEG) located at an interface between the GaN layer 305 and the AlGaN layer 306. Materials of the source 502 and drain 503 regions are generally annealed after formation. The crystalline passivation layer 401 and the amorphous passivation layer 501 must be removed/etched away first, in those areas where the source contact 502 and the drain contact 503 are formed. The gate region can be formed using photolithography or e-beam lithography processes.

Figure 6:
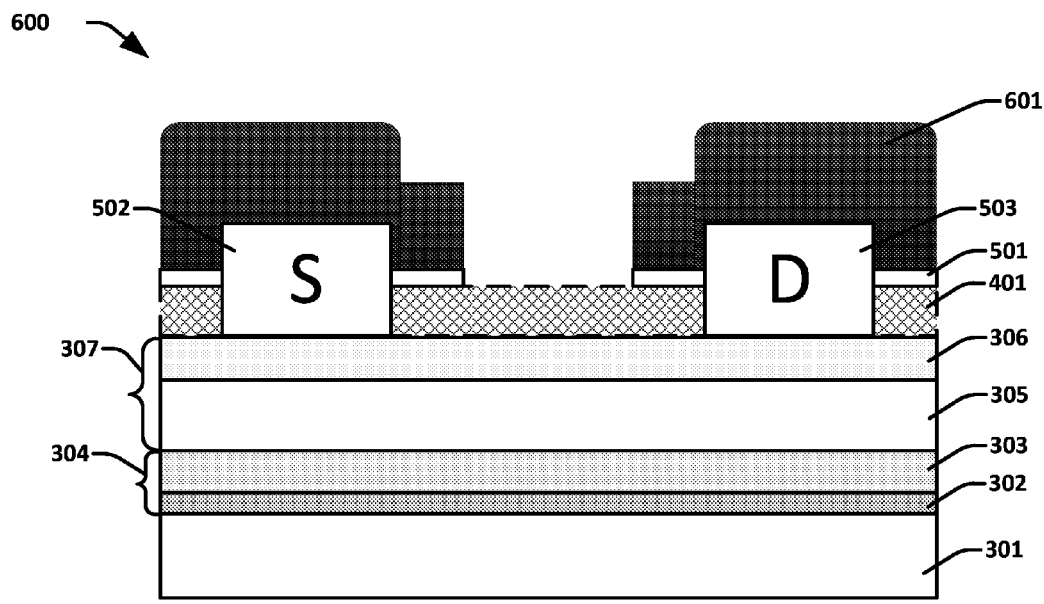
FIG. 6 shows some embodiments of a cross sectional view of a semiconductor device after the formation of capping layers.

In FIG. 6, capping layers 601 have been formed on opposite sides of a gate region. The capping layer 601 seals off pores in the structure of porous low-k dielectric 501 below it. After the capping layer has been formed the capping layer 601 and the amorphous passivation layer 501 are patterned and etched to create an opening for the gate metal contact or defining a gate region at a position in between the source and drain regions.

Figure 7:
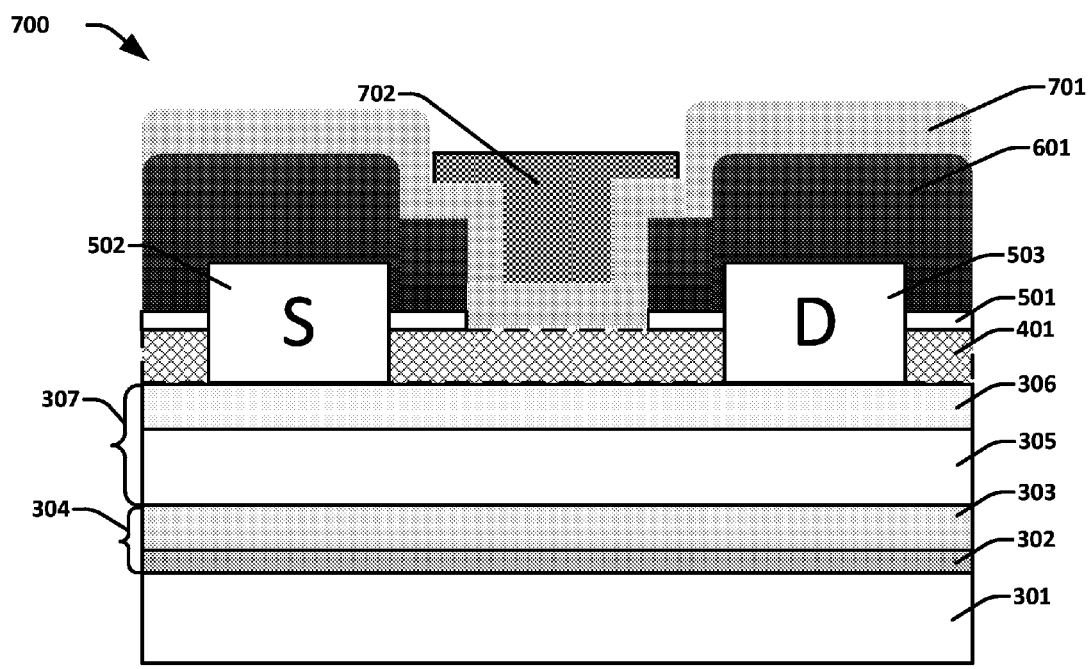
FIG. 7 shows some embodiments of a cross sectional view of a semiconductor device after the deposition of a dielectric layer and the gate metal.

In FIG. 7, a high-k dielectric layer or gate dielectric layer 701 is deposited all over the device. The high-k dielectric layer 701 prevents gate leakage and reduces dislocation generation. As device size scales down, leakage currents due to tunneling increase drastically, leading to high power consumption and reduced device reliability. High-k material allows increased gate capacitance without the associated leakage effects. In various embodiments, the high-k gate dielectric layer 701 may comprise silicon nitride (SiN), aluminum oxide (AlO3), silicon dioxide (SiO2), or other appropriate insulating materials. After the deposition of the gate dielectric 701, a gate electrode 702 is formed by depositing a gate metal in the defined gate region. In some embodiments, the gate electrode 702 is formed by selectively depositing a metal (e.g., Ti/Al/Ni/Au), by way of a deposition process (e.g., PVD, CVD, etc.).

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs. Additionally, layers described herein can be formed in any suitable manner, such as with spin on, sputtering, growth and/or deposition techniques, etc.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a crystalline passivation layer that can be deposited alone or prior to insulator deposition on III-nitride surfaces that reduce the effects of surface traps as well as create a good interface between a III-nitride surface and an insulator. The crystalline passivation layer will have a lattice constant that matches with the III-nitride material and the dielectric layer on top of it, and hence provides suitable bond-matching to either side of the interface. It also reduces the effects of surface traps by providing a coherent termination of the surface bonds. Thus, a good interface and other practical important properties of the passivation film can be realized by introducing this crystalline passivation layer.

In some embodiments, the present disclosure relates to a III-N (tri nitride) semiconductor device, comprising a buffer layer disposed above a semiconductor substrate, a crystalline or poly crystalline III-N layer disposed above the buffer layer and a crystalline passivation layer disposed directly above the single or poly crystal III-N layers.

In some embodiments, the present disclosure relates to a III-nitride high electron mobility transistor (HEMT) device comprising, an aluminum nitride (AlN) buffer layer disposed on a substrate, a first aluminum gallium nitride (AlGaN) layer disposed on the AlN buffer layer, a gallium nitride (GaN) layer disposed on the first AlGaN layer, a second aluminum gallium nitride (AlGaN) layer disposed on the GaN layer; and a crystalline passivation layer disposed directly on the second AlGaN layer.

In some embodiments, the present disclosure relates to a method of forming a III-nitride high electron mobility transistor (HEMT) device, comprising: forming a first buffer layer on top of a Si, SiC or sapphire substrate, forming a second buffer layer on top of the first buffer layer, forming a first III-nitride layer on top of the second buffer layer, forming a second III-nitride layer on top of the first III-nitride layer; and forming a crystalline passivation layer on top of the second III-nitride layer.

What is claimed is:

1. A III-N (tri nitride) semiconductor device, comprising:
   a buffer layer disposed above a semiconductor substrate;
   a crystalline or poly crystalline III-N layer disposed above the buffer layer;
   a crystalline passivation layer disposed above the crystalline or poly crystalline III-N layer;
   a source region and a drain region disposed onto and in direct contact with an upper region of the crystalline or poly crystalline III-N layer;
   a gate electrode disposed above the crystalline passivation layer at a lateral position between the source region and the drain region;
   a gate dielectric disposed beneath the gate electrode and abutting a top surface of the crystalline passivation layer, wherein the gate dielectric horizontally extends over upper surfaces of the source region and the drain region; and
   an amorphous passivation layer abutting the top surface of the crystalline passivation layer on opposite sides of the gate dielectric.

2. The semiconductor device of claim 1, wherein the crystalline passivation layer has a thickness in a range of approximately 20 nm to approximately 5000 nm.

3. The semiconductor device of claim 1, wherein the crystalline passivation layer comprises: SiNx, SiOx, Al2O3, BeO, MgO, Ga2O3, La2O3, HfO2, ZrO2, Y2O3, Gd2O3, Ce2O3, Ta2O3 or Ta2O5.

4. A III-nitride high electron mobility transistor (HEMT) device comprising:
   an aluminum nitride (AlN) buffer layer disposed on a substrate;
   a first aluminum gallium nitride (AlGaN) layer disposed on the AlN buffer layer;
   a gallium nitride (GaN) layer disposed on the first AlGaN layer;
   a second aluminum gallium nitride (AlGaN) layer disposed on the GaN layer;
   a crystalline passivation layer disposed directly on the second AlGaN layer;
   an amorphous passivation layer abutting the crystalline passivation layer;
   a gate dielectric disposed beneath a gate electrode and abutting a top surface of the crystalline passivation layer, wherein the amorphous passivation layer abuts the to surface of the crystalline passivation layer on opposite sides of the gate dielectric, and wherein the
   gate electrode is disposed within a recess in the gate dielectric and a bottom surface of the gate electrode is disposed above the amorphous passivation layer;
   a source region located at a first end of the second AlGaN layer;
   a drain region located at a second end of the second AlGaN layer opposite the first end, wherein the gate electrode is located at a position between the source region and the drain region; and
   a capping layer abutting upper surfaces of the source and drain regions.

5. The device of claim 4, wherein the source region and the drain region extend through the amorphous passivation layer to abut the second AlGaN layer.

6. The device of claim 4, wherein the gate dielectric is disposed above the capping layer and extends over the upper surfaces the source and drain regions.

7. The device of claim 4, wherein, the crystalline passivation layer comprises: AlN or AlGaN.

8. The device of claim 4, wherein, the substrate comprises: silicon carbide (SiC), pure silicon (Si) or sapphire.

9. A III-N (tri nitride) semiconductor device, comprising:
   a heterojunction structure disposed over a semiconductor substrate and including a first III-N layer abutting a second III-N layer, wherein the second III-N layer is disposed over the first III-N layer and differs from the first III-N layer;

a source region and a drain region which are disposed over an upper region of the second III-N layer and which are spaced apart from one another;

a gate electrode disposed over the heterojunction structure and disposed between the source and drain regions;

a crystalline passivation layer which abuts the upper region of the second III-N layer and which is disposed under the gate electrode and which separates the source and drain regions from one another;

a gate dielectric disposed beneath the gate electrode and separating the gate electrode from the crystalline passivation layer; and a capping layer abutting upper surfaces of the source and drain regions and vertically underlying the gate electrode, wherein the gate electrode is disposed within a recess within the capping layer and is separated from the capping layer by the gate dielectric, and wherein the gate dielectric continuously abuts an upper surface of the capping layer from a position underlying the gate electrode to positions overlying the source region and the drain region.

10. The III-N semiconductor device of claim 9, wherein the first III-N layer has a first bandgap and the second III-N layer has a second bandgap, the first bandgap being less than the second bandgap.

11. The III-N semiconductor device of claim 9, wherein the first III-N layer is GaN, the second III-N layer is AlGaN, and the crystalline passivation layer is AlN or AlGaN.

12. The III-N semiconductor device of claim 9, wherein the crystalline passivation layer comprises: AlN, $In_xAl_yGa_zN$ ($x+y+z=1$; $0<x<1$, $0<y<1$, and $0<z<1$), silicon nitride, $SiO_2$, $Al_2O_3$, BeO, MgO, $Ga_2O_3$, $La_2O_3$, $HfO_2$, $ZrO_2$, $Y_2O_3$, $Gd_2O_3$, $Ce_2O_3$, $Ta_2O_3$, or $Ta_2O_5$.

13. The III-N semiconductor device of claim 9, further comprising:

a planar amorphous passivation layer disposed above the crystalline passivation layer, beneath the gate electrode, and between the source and drain regions.

14. The III-N semiconductor device of claim 13, wherein the amorphous passivation layer extends between source and drain regions over the crystalline passivation layer but terminates on sidewalls of the gate dielectric so as so not to extend directly under a lowermost portion of the gate dielectric.

15. The III-N semiconductor device of claim 9, further comprising:

a plurality of buffer layers arranged between the semiconductor substrate and the heterojunction structure to limit or smooth lattice strain between the substrate and the heterojunction structure.

16. The III-N semiconductor device of claim 1, further comprising:

a capping layer disposed above the crystalline passivation layer, the source region and the drain region.

17. The III-N semiconductor device of claim 16, wherein the gate dielectric extends above the capping layer and wherein the gate electrode is disposed within a recess within the capping layer.

18. The III-N semiconductor device of claim 1, wherein the amorphous passivation layer extends between source and drain regions over the crystalline passivation layer but terminates on sidewalls of the gate dielectric so as not to extend directly under a lowermost portion of the gate dielectric.

19. The III-N semiconductor device of claim 16, wherein the capping layer overlies upper surfaces of the source and drain regions.

20. The III-N semiconductor device of claim 17, wherein the gate dielectric follows a contour of the capping layer while extending above the source region and the drain region.

* * * * *

UNITED STATES PATENT AND TRADEMARK OFFICE
CERTIFICATE OF CORRECTION

Page 1 of 1

PATENT NO. : 9,130,026 B2
APPLICATION NO. : 14/016302
DATED : September 8, 2015
INVENTOR(S) : Chiu et al.

It is certified that error appears in the above-identified patent and that said Letters Patent is hereby corrected as shown below:

In the claims

Column 8, Claim 4, Line 38 replace "…abuts the to…" with --…abuts the top--

Signed and Sealed this
Twenty-sixth Day of January, 2016

Michelle K. Lee
*Director of the United States Patent and Trademark Office*